United States Patent [19]
Naulleau et al.

[11] Patent Number: 6,111,646
[45] Date of Patent: Aug. 29, 2000

[54] NULL TEST FOURIER DOMAIN ALIGNMENT TECHNIQUE FOR PHASE-SHIFTING POINT DIFFRACTION INTERFEROMETER

[76] Inventors: Patrick Naulleau, 5239 Miles Ave., Apt. A, Oakland, Calif. 94618; Kenneth Alan Goldberg, 1622 Oxford St., #5t, Berkeley, Calif. 94709

[21] Appl. No.: 09/229,449

[22] Filed: Jan. 12, 1999

[51] Int. Cl.[7] ........................................ G01B 9/02
[52] U.S. Cl. ............................. 356/354; 356/400
[58] Field of Search ........................ 356/354, 400, 356/345

[56] References Cited

PUBLICATIONS

Naulleau, Patrick, et al. "Characterization of the accuracy of EUV phase–shifting point diffraction interferometry", *SPIE*, v. 3331 (1998) 114–123.

Anderson, Erik H., et al., "Electron beam lithography digital pattern generator and electronics for generalized curvilinear structures", *J. Vac. Sci. Technol.B*, vol. 13, No. 6, (1995) 2529–2534.

Brophy, Chris P., "Effect of intensity error correlation on the computed phase of phase–shifting interferometry", *J. Opt. Soc. Am. A*, vol. 7, No. 4 (1990) 537–541.

Medecki, H., et al., "Phase–shifting point diffraction interferometer" *Optics Letters*, vol. 21, No. 19 (1996) 1526–1528.

*Primary Examiner*—Robert H. Kim
*Assistant Examiner*—Andrew H. Lee
*Attorney, Agent, or Firm*—Burns, Doane, Swecker & Mathis, L.L.P.

[57] ABSTRACT

Alignment technique for calibrating a phase-shifting point diffraction interferometer involves three independent steps where the first two steps independently align the image points and pinholes in rotation and separation to a fixed reference coordinate system, e.g, CCD. Once the two sub-elements have been properly aligned to the reference in two parameters (separation and orientation), the third step is to align the two sub-element coordinate systems to each other in the two remaining parameters (x,y) using standard methods of locating the pinholes relative to some easy to find reference point.

41 Claims, 10 Drawing Sheets

NULL TEST FOURIER DOMAIN ALIGNMENT TECHNIQUE FOR PHASE-SHIFTING POINT DIFFRACTION INTERFEROMETER

The U.S. Government has certain rights in this invention pursuant to Contract No. DE-AC03-76SF00098 between the United States Department of Energy and the University of California for the operation of the Lawrence Berkeley National Laboratory.

BACKGROUND OF THE INVENTION

1. Field of the Invention

The present invention relates to interferometers for making highly accurate measurements of wavefront aberrations, particularly to phase-shifting point diffraction interferometers and methods for calibrating them.

2. State of the Art

Optical metrology is the characterization of surfaces and materials using optical methods. An area of optical metrology relevant to the present invention is the use of an interferometer to measure the quality of a test optic, such as a single or multiple element mirror or lens system.

One important recent application of optical metrology is the testing of projection optics for photolithography systems. Modern photolithography systems used to fabricate integrated circuits must continually image smaller features. In pursuit of this goal, systems are confronted with the diffraction limit determined in part by the wavelength of the light employed. To meet the challenge of imaging ever smaller features, photolithographic systems must employ successively shorter wavelengths. Over the history of integrated circuit fabrication technology, photolithography systems have moved from visible to ultraviolet and may eventually move to even shorter wavelengths such as extreme ultraviolet or to yet shorter X-ray radiation.

For the extreme case of X-ray lithography, a proximity method that does not require re-imaging optics is under development. In X-ray proximity lithography, feature sizes are considerably larger than the wavelength limit. However, reticles in this case are required to have feature sizes equal to the desired printed feature size, currently on the order of 0.1 microns and smaller. It is quite difficult and expensive to manufacture reticles having such small feature sizes. Additionally, radiation passing through the reticle's narrow slits and apertures still diverges despite the extremely short wavelength. Thus, the reticles must be placed very close to the wafer, sometimes as close as a few microns, so that the shadow-cast image of the reticle remains sharp on the wafer. These systems must be carefully designed such that the reticle never contacts the wafer, an event that could destroy the reticle.

Because of the difficulties posed by proximity imaging a reticle pattern onto a wafer, it is desirable to extend the concepts of projection optics as currently used in visible-light or deep-ultraviolet lithography systems to even shorter wavelengths such as extreme ultraviolet. Such systems employ lenses or other optical elements to project a demagnified image of the reticle onto the wafer surface. This allows reticles to retain larger feature sizes, thus reducing the expense of generating the reticle itself As with all optical imaging systems, various aberrations such as spherical aberration, astigmatism, and coma may be present. These aberrations must be identified and removed during the fabrication and/or alignment of the projection optics, or the projection optics would introduce substantial blurring in the image projected onto the wafer.

In order to test the projection optics for various aberrations, interferometers may be employed. Conventional interferometers, based upon the Michelson design for example, employ a single coherent light source (at an object plane) which is split into a test wave and a reference wave. The test wave passes through the optic under test and the reference wave avoids that optic. The test and reference waves are recombined to generate an interference pattern or interferogram. Analysis of the interferogram, and the resultant wavefront with, for example, Zernike polynomials, indicates the presence of aberrations.

The reference wave of the interferometer should be "perfect"; that is, it should be simple and well characterized, such as a plane or spherical wave. Unfortunately, beam splitters and other optical elements through which the reference beam passes introduce some deviations from perfection. Thus, the interferogram never solely represents the condition of the test optic. It always contains some artifacts from the optical elements through which the reference wave passes. While these artifacts, in theory, can be separated from the interferogram, it is usually impossible to know that a subtraction produces a truly clean interferogram.

To address this problem, "point diffraction interferometers" have been developed. An example of a point diffraction interferometer is the phase-shifting point diffraction interferometer (PS/PDI) described in H. Medecki, et al., "Phase-Shifting Point Diffraction Interferometer", *Optics Letters*, 21(19), 1526–28 (1996), E. Tejnil, et al., "At-Wavelength Interferometry for EUV Lithography," *J. Vacuum Science & Tech. B*, 15, 2455–2461 (1997), K. A. Goldberg, et al., "Characterization of an EUV Schwarzchild Objective Using Phase-Shifting Point Diffraction Interferometry," *Proceeding SPIE*, 3048, 264–270 (1997), E. Tejnil, et al., "Phase-Shifting Point Diffraction Interferometry for At-Wavelength Testing of Lithographic Optics," *OSA Trends in Optics and Photonics: Extreme Ultraviolet Lithography,* Optical Society of America, Washington, D.C., 4, 118–123 (1996), K. A. Goldberg, "Extreme Ultraviolet Interferometry," doctoral dissertation, Dept. of Physics, Univ. of California, Berkeley (1997), and in the U.S. Patent Application "Phase-Shifting Point Diffraction Interferometer," Inventor Hector Medecki, Ser. No. 08/808,081, filed Feb. 28, 1997, which are all incorporated herein by reference.

Figure 8A:
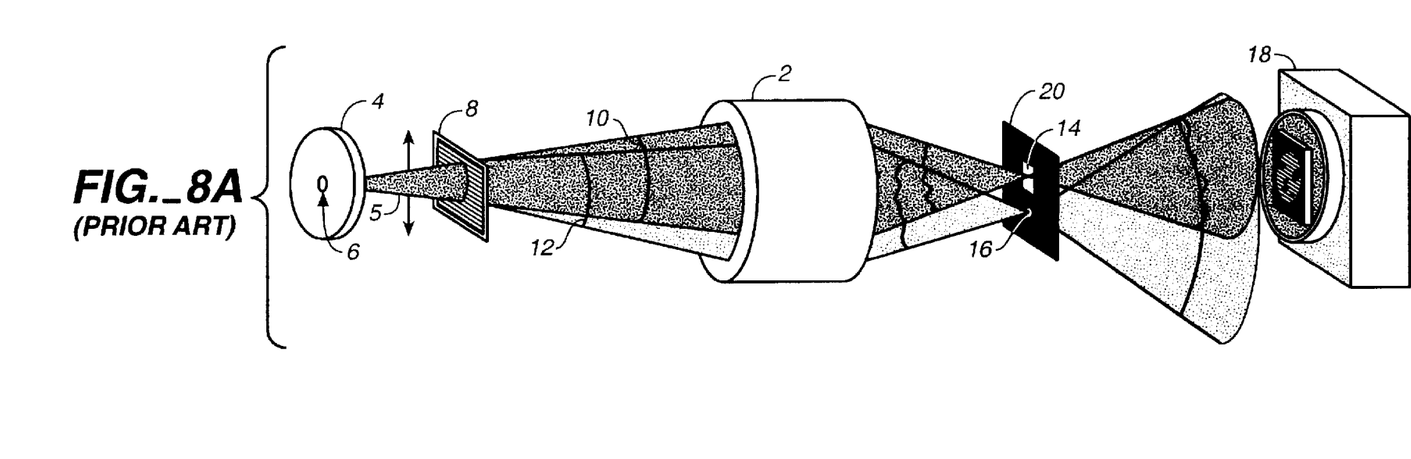
FIG. 8A is a schematic of a prior art phase-shifting point diffraction interferometer.
Figure 8B:
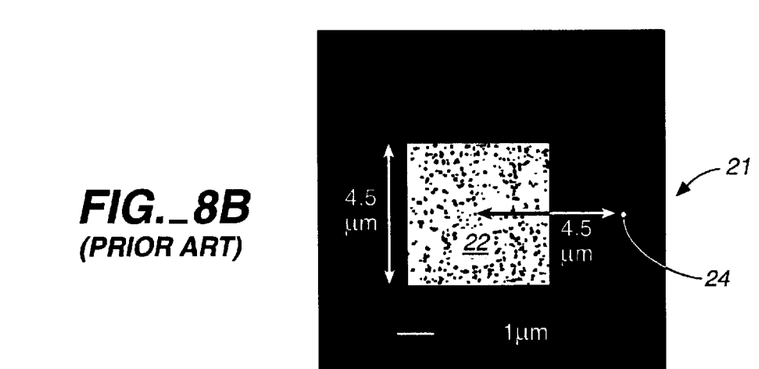
FIG. 8B illustrates a prior art phase-shifting point diffraction interferometer mask.

The PS/PDI is a variation of the conventional point diffraction interferometer in which a transmission grating has been added to greatly improve the optical throughput of the system and add phase-shifting capability. In the PS/PDI, as illustrated in FIG. 8A, the optical system 2 under test is illuminated by a spherical wave 5 that is generated by an entrance pinhole 6 in a mask 4 that is placed in the object plane of the optical system 2. To assure the quality of the spherical wave illumination, pinhole 6 is chosen to be several times smaller than the resolution limit of the optical system. Grating 8 splits the illuminating beam 5 to create the required test and reference beams 10 and 12, respectively. A PS/PDI mask 20 is placed in the image plane of the optical system 2 to block the unwanted diffracted orders generated by the grating 8 and to spatially filter the reference beam 12 using a reference pinhole 16. The test beam 10, which contains the aberrations imparted by the optical system, is largely undisturbed by the image plane mask by virtue of it passing through a large (relative to the point spread function of the optical system) window 14 in the PS/PDI mask 20. The test and reference beams propagate to the mixing plane where they overlap to create an interference pattern recorded on a CCD detector 18. The recorded interferogram yields information on the deviation of the test beam from the reference beam which in the ideal case is a spherical wave. FIG. 8B depicts a PS/PDI mask 21 comprising a square shaped window 22 and a reference pinhole 24 to the right which has a diameter of less than 100 nm.

If the optical system under test were perfect (i.e., generating a perfect spherical wave) the interferogram would consist of a hyperbolic fringe field due to the fact that the interference pattern arises from the addition of two laterally-sheared spherical waves. These hyperbolic fringes lead to apparent aberrations in the resultant wavefront. Furthermore, when the optical system is not perfect, the quality of the reference beam depends upon how well the reference pinhole spatially filters the aberrations imparted by the optical system under test. These two effects limit how accurately an uncalibrated PS/PDI can measure the wavefront of an optical system under test.

As is apparent, the accuracy of the PS/PDI measurement system comes from the pinhole-diffraction-generated reference and illumination beams. This type of high-accuracy interferometer can be implemented in any spectral regime. The theoretical accuracy of the PS/PDI can be inferred by way of rigorous diffraction theory but, in practice, it is preferable to determine the accuracy and calibrate an interferometer based on actual measurements.

In order to experimentally calibrate and characterize the accuracy of the PS/PDI, a null test is performed. The null test consists of replacing the standard PS/PDI mask with a so-called "null-mask". In the null-mask, the large test beam window of the PS/PDI mask is replaced by a second pinhole, identical to the reference pinhole. Instead of interfering the aberrated wavefront from the optic under test with a reference spherical wave (spatially filtered version of the test beam), two spherical waves (spatially filtered versions of the test beam) are interfered. Under ideal conditions, the two wavefronts will be truly spherical and the primary aberration seen in the resultant wavefront will be coma due to the hyperbolic fringe field created by two interfering spherical waves. Other aberrations present in the measurement are indicative of systematic and random errors in the system. The aberrations remaining, after removal of the systematic effects attributable to the interferometer geometry, limit of the accuracy of the interferometer.

The major difficulty in performing the null test on the PS/PDI is the required alignment of two focused beams onto two pinholes that are smaller than the diffraction-limited resolution of the optic under test. Experimental results have shown the null test results to be susceptible to misalignment. The required alignment tolerance was found to be on the order of one-tenth of the diffraction-limited image point size, which for typical EUV lithographic optics corresponds to an alignment tolerance of 15 nm or smaller. In the conventional PS/PDI configuration used for optical system testing, as illustrated in FIGS. 8A and 8B, the alignment procedure consists primarily of aligning the reference beam to the reference pinhole. Because the test beam window is large relative to the image point size and is on par with the image point separation, the exact separation and rotational orientation of the two image points is not critical. For the null test alignment on the other hand, the two image points have to be aligned to two pinholes simultaneously. In this case, image point separation and orientation become critical, thus the alignment procedure in the null test mode is significantly more challenging than is the alignment procedure in the conventional optic system testing mode. The art is in search of a fast, repeatable, and systematic method for performing the alignment required to implement the null test.

SUMMARY OF THE PRESENT INVENTION

Conventional alignment techniques work by interactively optimizing the interferometric fringe pattern by varying the various alignment parameters ill situ. This process is prohibitively difficult in the null test case due to the large number of alignment parameters. The inventive technique overcomes this problem by delineating the alignment procedure into three independent steps, thereby greatly reducing the parameter space for each step. The first two steps of the technique involve independently aligning the image points and pinholes in rotation and separation to a fixed reference coordinate system, e.g., CCD. Once the two sub-elements have been properly aligned to a reference coordinate system in two parameters (separation and orientation), the third step is to align the two sub-element coordinate systems to each other in the two remaining parameters (x,y) using standard methods. A standard method relies on locating the pinholes relative to some easy to find reference point. In a preferred embodiment, the reference point is the large (relative to the point-spread function of the optical system under test) alignment window.

Accordingly, one aspect the invention is directed to a method of measuring the accuracy of a phase-shifting point diffraction interferometer defining an optical path that includes (i) a source of electromagnetic energy in the optical path, (ii) a beam divider in the optical path for dividing electromagnetic radiation from the source into a reference beam and a test beam, (iii) an optical element under test in the optical path, and (iv) a fixed reference coordinate system in the optical path downstream from the source of electromagnetic energy, wherein the method includes the steps of:

(a) positioning a null test mask in the image plane of the optical element under test upstream of the fixed reference coordinate system wherein the mask has a region that is at least semi-transparent and at least one pair of pinholes and a corresponding alignment window, wherein each pair of pinholes comprises a first pinhole and a second pinhole that are spaced apart at a predetermined distance;

(b) activating the source of electromagnetic radiation and directing the electromagnetic radiation to the beam divider to generate a reference and a test beam that are directed by the optical element under test to the null test mask whereby the two beams create first and second image points on the mask;

(c) adjusting the position of the first and second image points such that the first and second image points lie on said region of the mask;

(d) determining the (i) first rotational orientation of the first and second image points with respect to the fixed reference coordinate system and (ii) the first separation between the first and second image points by examining interference fringes created by light from the first and second image points propagating through said region of the mask;

(e) adjusting the position of the first and second image points such that at least part of the reference beam passes through the first pinhole and at least part of the test beam passes through the second pinhole, respectively;

(f) determining the (i) second rotational orientation of the first and second pinholes of a pair of pinholes in the mask with respect to the fixed coordinate system and (ii) the second separation between the first and second pinholes by examining interference fringes created by light from the first and second image points propagating through the pair of pinholes;

(g) adjusting the rotation of at least one of (i) the beam divider or (ii) the mask so that the first rotational orientation substantially matches the second rotational orientation;

(h) adjusting the position of the beam divider so that the first separation substantially matches the second separation; and (i) measuring aberrations of the phase-shifting point diffraction interferometer.

In one embodiment (d) includes the steps of:

determining the (i) first rotational orientation of the first and second image point with respect to the fixed reference coordinate system and (ii) the first separation between the first and second image points by calculating the two-dimensional carrier frequency of the fringes; and wherein step (f) includes:

determining the (i) second rotational orientation of the first and second pinholes of a pair of pinholes in the mask with respect to the fixed coordinate system and (ii) the second separation between the first and second pinholes by calculating the two-dimensional carrier frequency of the fringes.

In another embodiment (d) includes the steps of:

determining the (i) first rotation orientation of the first and second image points with respect to the fixed reference coordinate system and (ii) the first separation between the first and second image points by calculating the Fourier transform of the interference fringes created by the light from the first and second image points propagating through said region of the mask in order to find the two-dimensional carrier frequency of the fringes; and wherein step (f) includes:

determining the (i) second rotational orientation of the first and second pinholes of a pair of pinholes in the mask with respect to the fixed coordinate system and (ii) the second separation between the first and second pinholes by calculating the Fourier transform of the interference fringes created by the light from the two image points propagating through the pinhole pair in order to find the two-dimensional carrier frequency of the fringes.

In yet another embodiment (d) includes the steps of:

determining the (i) first rotational orientation of the first and second image points with respect to the fixed reference coordinate system and (ii) the first separation between the first and second image points by calculating the tilt term of the wavefront defined by the interference fringes created by the light from the two image points propagating through said region of the mask in order to find the two-dimensional carrier frequency of the fringes; and wherein step (f) includes:

determining the (i) second rotational orientation of the first and second pinholes of a pair of pinholes in the mask with respect to the fixed coordinate system and (ii) the second separation between the first and second pinholes by calculating the tilt term of the wavefront defined of the interference fringes created by the light from the first and second image points propagating through the pinhole pair in order to find the two-dimensional carrier frequency of the fringes.

In a further embodiment, the at least one pair of pinholes are positioned to the corresponding alignment window at a known distance and direction, and wherein step (e) includes the steps of:

moving at least one of the (i) the optical element under test, (ii) the mask, or (iii) or the source of electromagnetic energy so that the at least one of the reference beam or test beam passes through the alignment window; and moving at least one of the (i) the optical element under test, (ii) the mask, or (iii) or the source of electromagnetic energy a prescribed distance determined from the known alignment-window to pinhole separation so that at least part of the reference beam passes through the first pinhole and at least part of the test beam passes through the second pinhole, respectively.

BRIEF DESCRIPTION OF THE DRAWING

The present invention may be further understood from the following description in conjunction with the appending drawing.

DETAILED DESCRIPTION OF THE PREFERRED EMBODIMENT

Figure 1A:
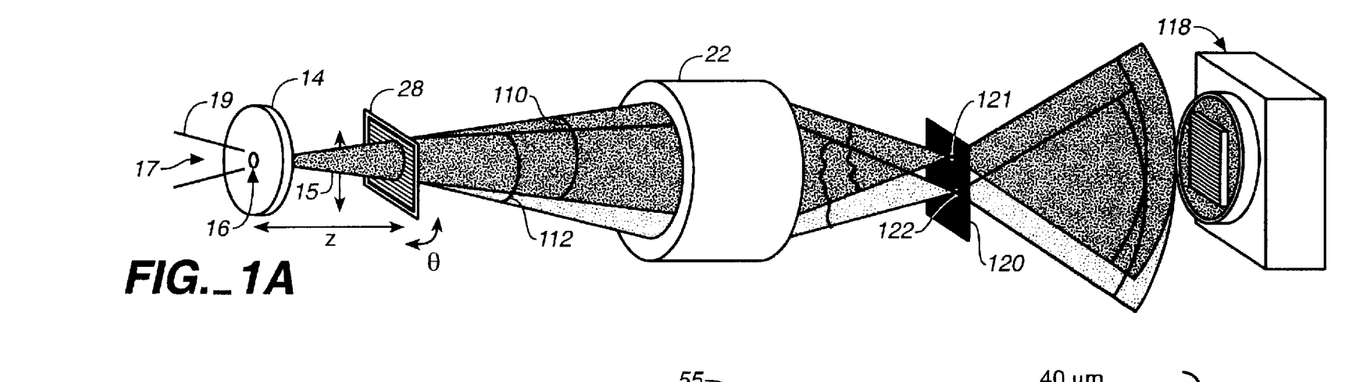
FIG. 1A is a schematic of a phase-shifting point diffraction interferometer in the null-test configuration.

A PS/PDI system implementing the null test is illustrated in FIG. 1A. The system includes a source of electromagnetic radiation 17 which directs a beam 19 onto an entrance pinhole 16 located in mask 14 that is placed in the object plane of the optical system 22. If the entrance pinhole is sufficiently small, the electromagnetic radiation 15 emitted through the entrance pinhole 16 is spatially coherent and essentially spherical. To this end, the entrance pinhole 16 is chosen to be several times smaller than the resolution limit of the optical system. The optical system 22 under test is illuminated by the essentially spherical wave 15. Beam divider 28, e.g., a transmission grating, splits the illuminating beam 15 to create the required test and reference beams 110 and 112, respectively. A null-mask 120 comprising pinholes 121 and 122 is placed in the image plane of the optical system 22 to block the unwanted diffracted orders generated by the beam divider 28 and to spatially filter the test and reference beams 110 and 112, respectively.

Positioned downstream is a fixed reference coordinate system 118 that functions as a reference to which the image point pair and the pinhole pair can be independently aligned. Examples of fixed reference coordinate systems include a camera with a photosensitive film, and a Vidicon camera; a preferred fixed reference coordinate system is a charged-couple device (CCD). The test and reference beams propagate to the mixing plane where they overlap to create an interference pattern recorded on the CCD detector 18.

Figure 1B:
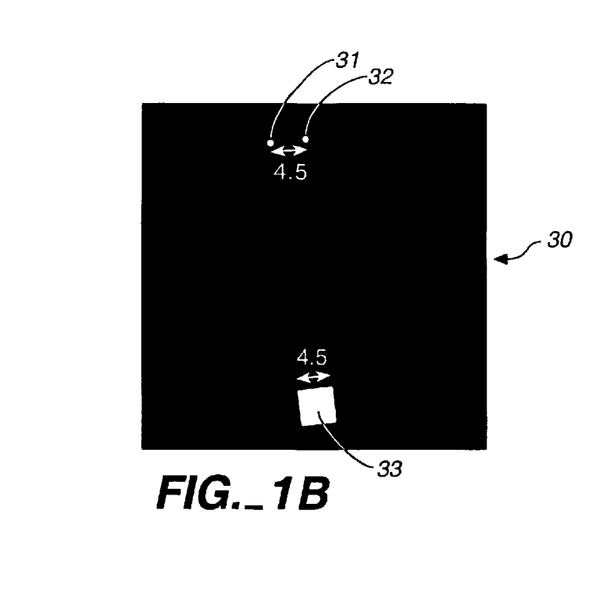
FIG. 1B illustrates a null-mask.

FIG. 1B depicts a null-mask 30 comprising first and second pinholes 31 and 32, that are preferably identical in size, and an alignment window 33. (Null-mask 30 is a detailed proportionally correct view of null-mask 120 of FIG. 1A.) Each pinhole is usually in the 50 to 150-nm diameter range and they are created by electron beam lithography and reactive ion etching. In one embodiment, the mask comprises a 200-nm thick Ni absorbing layer evaporated on a 100 nm $Si_3N_4$ membrane. The null-mask features are etched completely through the membrane prior to the Ni evaporation. Thus, the pinholes are completely open in the finished null-mask, which maximizes their transmission.

FIG. 1A shows that the initial orientation of the pinholes 121 and 122 is set by the rotation of the null-mask 120 and the separation of the pinholes 121 and 122 is fixed. In order to achieve alignment between the image point pair and the pinhole pair, rotation control of the grating or mask and longitudinal position control of the grating are required as further described herein.

PS/PDI systems may be configured many different ways. The source of electromagnetic radiation may be, for example, a laser or some other quasi-monochromatic source. If the source of radiation provides a spherical wave, the interferometer does not need to include the entrance pinhole through which radiation passes before it illuminates the test optic as described above.

The beam divider is preferably, though not necessarily, located between the source of electromagnetic radiation and the test optic region. Examples of suitable beam dividers include reflection type diffraction gratings, transmission type diffraction gratings, and polarization beamsplitters.

The preferred method for achieving rotational and separation alignment is by control of the beam divider. The beam divider can, for example, be mounted on a rotation stage with height control. In this case, the stage could be used to control the beam divider rotational orientation which would in turn control the image point rotational orientation and the stage could also control the separation between the beam divider and the entrance pinhole which would in turn control the image point separation. It is convenient for the stage to be controllable in situ. For certain applications such as extreme ultraviolet interferometry, where the system under test must be placed in vacuum, in situ control requires the stage motion to be in-vacuum motor actuated or manually actuated with vacuum feed-throughs.

Null-Mask Design

The invention facilitates the proper alignment of the two image points in the image plane to the two pinholes in the null-mask.

FIG. 1A illustrates that (i) the orientation of the image points created by the test and reference beams 110 and 112 and null-mask 120 is related to the orientation of the grating 18 and concomitantly (ii) the distance between the image points is related to the distance separating the entrance pinhole 16 and the grating 18. In a preferred embodiment, adjusting the orientation of the image points is accomplished by moving the grating 18 along rotation angle as shown. Moreover, adjusting the distance between the image points is accomplished by moving the grating 18 away or toward the input pinhole 16. As the separation, z, between the grating 18 and the entrance pinhole 16 increases, the distance between image points increases. By proper control of the grating orientation and the grating-to-entrance-pinhole separation, the image points can be aligned with the pinholes 121 and 122 in null-test mask 120.

Figure 2:
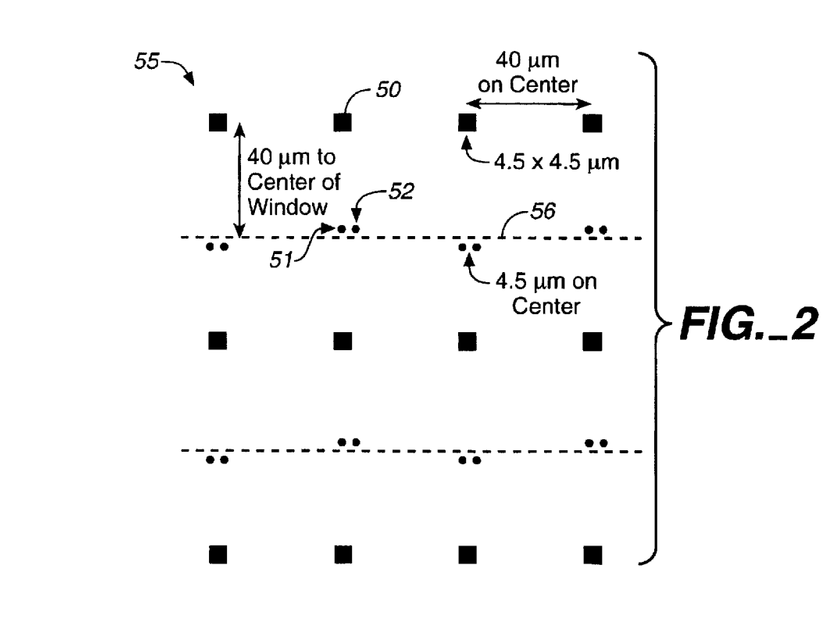
FIGS. 2, 3A, 3B and 3C and 4A, 4B and 4C illustrate null-mask arrays.

FIG. 2 shows another embodiment null-mask design which includes an array of null-masks each comprising dual pinholes and an alignment window. The array is used to facilitate the alignment and to allow a variety of pinholes to be studied without going through the extended task of changing masks. The null-mask comprises a plurality of pinhole pairs 51 and 52 and corresponding alignment or reference windows 50. The arrangement of the null-masks along row 56 are staggered in height to prevent higher grating orders from passing through adjacent null-mask pinholes. Square windows of dimensions preferably much larger than the image point size are placed above and below the pinhole pairs for x-y alignment purposes. Typically, the window width is set equal to the image-plane point separation.

Implementing the null test using the mask design of FIG. 2 requires residual transmission through the mask in order to determine the grating-induced image point separation and orientation. The transmission method is effective down to pinhole sizes of ~100 nm because at this pinhole size or larger, a 200 nm Ni mask provides sufficient attenuation to observe the two-pinhole fringes, yet enough transmission to observe the transmission-fringes when the image points are moved away from the pinholes. However, when smaller pinholes are used, a more attenuating mask is required to prevent the residual transmission from overpowering the extremely small amount of light diffracted by the pinholes. This additional attenuation, unfortunately, also makes observing the grating transmission-fringes impossible due to detector limitations. In order to overcome the high-attenuation problem, null-masks with alignment features can be used as described herein.

Another problem that arises when going to smaller pinholes with the mask design in FIG. 2 is the relatively large alignment windows and their close proximity to the pinhole pairs. This allows an inordinate amount of scattered light to propagate through open areas in the mask when compared to the extremely small amount of light getting through the sub-100-nm pinholes. Using fewer and smaller alignment windows and placing them farther apart alleviates this problem. The principle purpose of these windows is to provide easy-to-find references that are known distances from the pinhole pairs.

Figure 3A:
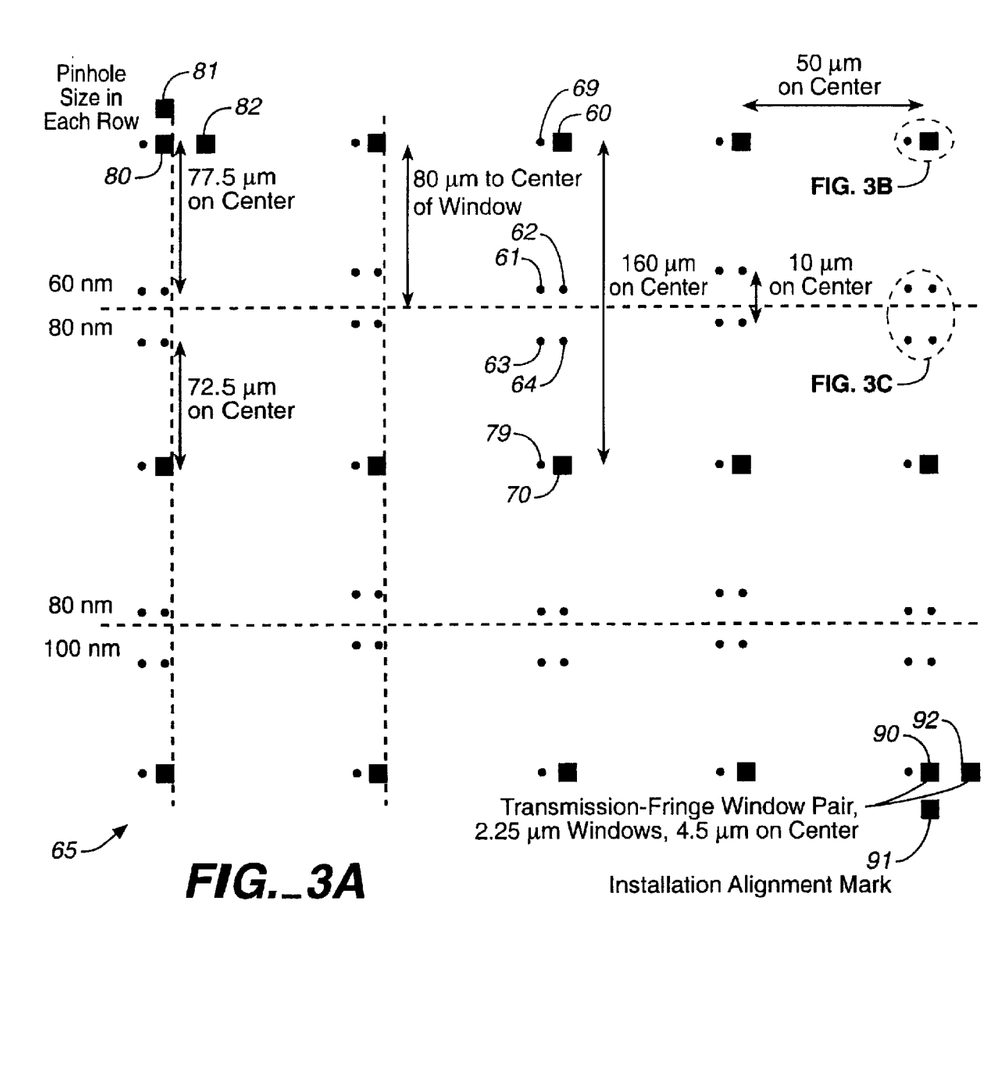
Figure 3B:
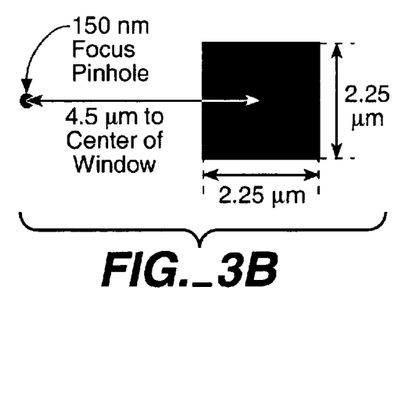
Figure 3C:
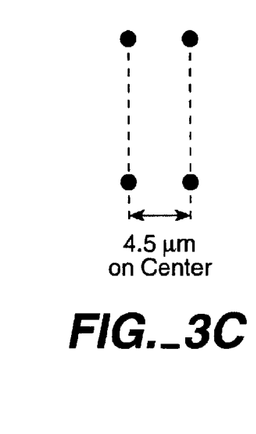

FIGS. 3A, 3B and 3C show a null-mask array 65 that is particularly suited for small pinhole (<100 nm diameter) null tests. Referring to the third column of null-mask array 65, the array includes a plurality of pinhole pairs 61 and 62 (4.5 $\mu$m on center apart) and a corresponding alignment window 60 which is located about 75 $\mu$m away from the pinhole pair. Similarly, pinhole pairs 63 and 64 are associated with alignment window 70. To reduce the scattered light problem, the alignment windows 60 (2.25 $\mu$m×2.25 $\mu$m) have been reduced by a factor of two in size relative to the mask design in FIG. 2 and their separation from the closest pinhole pair has been increased from 37.5 $\mu$m to 72.5 $\mu$m. In addition, the column to column separation has been increased from 40 $\mu$m to 50 $\mu$m. In order to maintain the density of null-masks in the array, two null-masks have been placed between each alignment window pair. This method could readily be extended to further increase the null-mask density in the array.

Figure 4A:
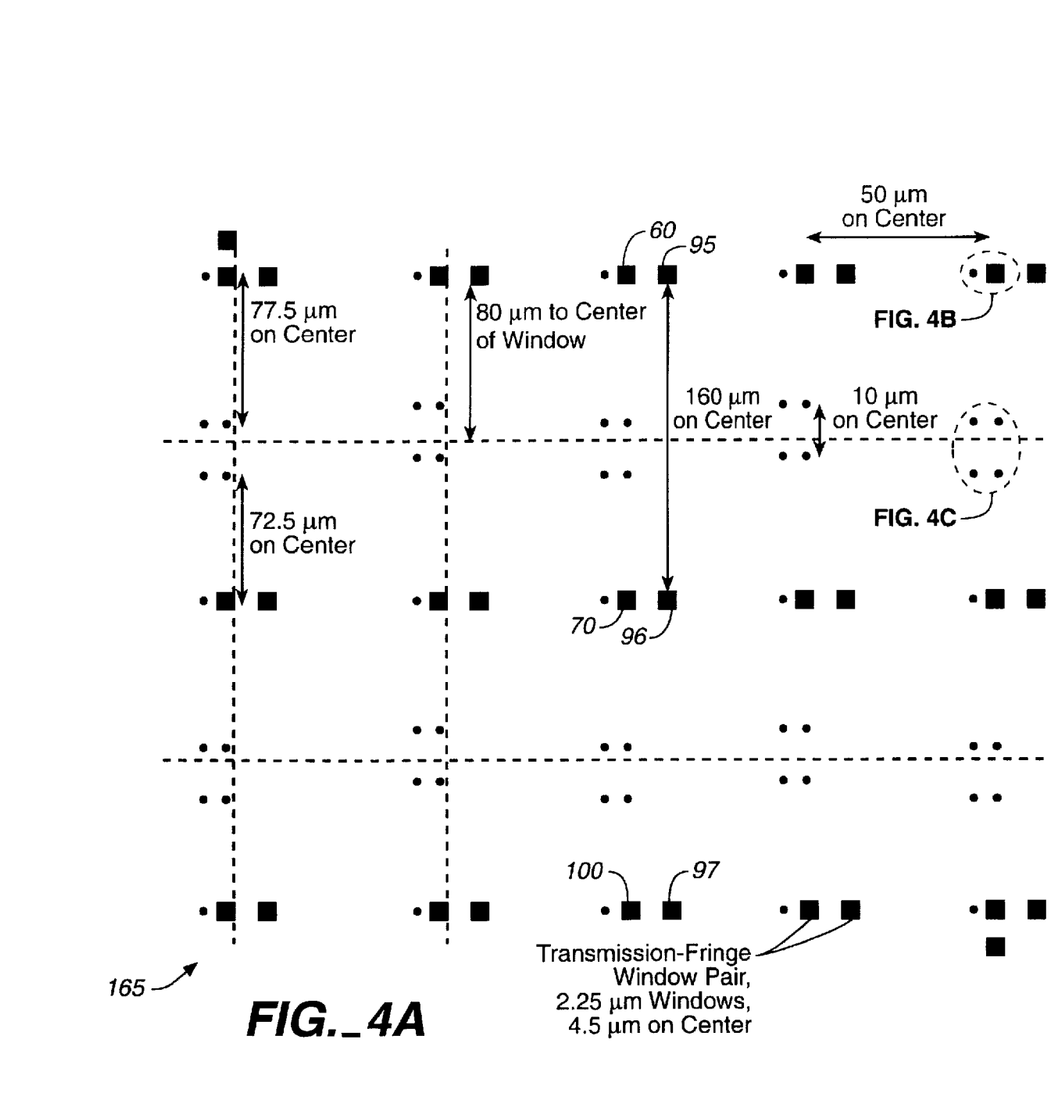
Figure 4B:
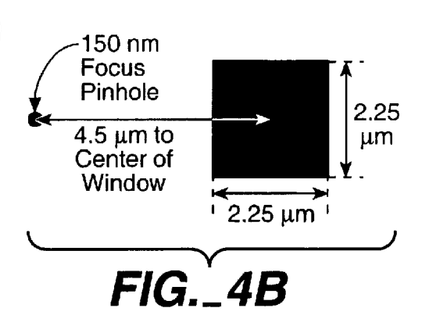
Figure 4C:
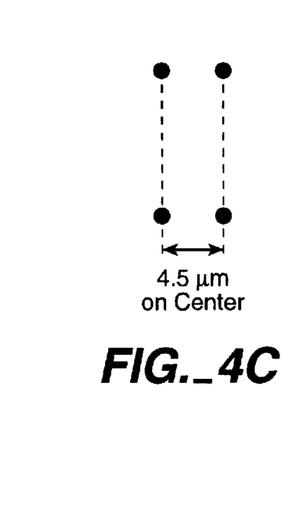

As discussed above, the smaller pinholes require a higher absorption mask; this is achieved by increasing the absorber (Ni) thickness from 200 nm to 240 nm. At 240 nm of Ni the mask transmission is only ~$10^{-7}$ for the 13.4 nm wavelength light used in the implementation described here, making transmission-fringes impossible to detect on a CCD. To overcome this problem, grating alignment aids have been added to the null-mask array. These aids are windows 82 at the top left and 92 bottom right corners of the array that are adjacent to alignment windows 80 and 90, respectively. Windows 80, 82 and 90, 92, respectively, form two pairs of 2.25 $\mu$m windows separated by 4.5 $\mu$m on center in the direction of the pinhole separation. These window pairs allow two grating orders to pass unobstructed through the mask. These two grating orders are then used to perform the grating alignment instead of relying on the transmission fringes. The extra alignment windows orthogonal to the pinhole separation, 81 and 91, have been added as visual alignment marks for the initial mounting of the null-mask array. If scatter is of little concern, it could be beneficial to replace all the single reference windows with reference window pairs as illustrated in FIGS. 4A, 4B and 4C. The null-mask 165 has substantially the same elements as those of null-mask 65 but further include reference windows pair such as, for example, pairs 60 and 95, 70 and 96, and 100 and 97. In this case, the grating alignment could be performed in many more places in the array, thereby, reducing the required time for moving from the pinhole orientation characterization mode to the grating orientation characterization mode.

Another significant problem with performing null tests using very small pinholes is focusing. In order to get a reasonable amount of light to pass through sub-100-nm pinholes, focusing is crucial. With the conventional mask design, focusing is achieved by performing a "knife-edge" test using a reference window edge. In this technique, a knife-edge is scanned across the focus of the optic under test. The intensity of radiation passing by the knife-edge is monitored. A transition region is observed between maximum intensity (when the beam passes by free of the knife-edge) and minimum intensity (when the beam is completely blocked by the knife-edge). The width of this transition region roughly gauges the quality of the focus, with a smaller transition region corresponding to a sharper focus. In practice, the width of the measured transition depends both on the size of the focused image point and on the quality of the knife-edge. When trying to achieve the extremely tight focus required for performing the null test with small pinholes, this method does not provide sufficient accuracy. Furthermore, this method is very time consuming.

The enhanced mask array designs described in FIGS. 3 and 4 have addressed the focusing problem by converting all the simple alignment windows to PS/PDI masks with 150-nm reference pinholes. These PS/PDI masks allow conventional PS/PDI interferometry to be performed in order to focus accurately. Focus is achieved by interferometrically measuring the wavefront, determining the Zernike defocus term, and adjusting the image-plane mask height position in order to null-out the Zernike defocus term and, hence, bring the system into the best possible focus.

As is appreciated by those skilled in the art, the electromagnetic radiation employed in the PS/PDI is not limited to soft X-rays (also referred to as extreme ultraviolet) since the radiation wavelength will depend on the particular application. Indeed, the wavelength can range, for instance, from about 5 nm to 1500 nm. As a consequence, the dimensions of the pinhole in the entrance mask, of the pinholes in the null-mask, and of the alignment windows will depend on the wavelength of the radiation used. Typically, the pinholes in the null-mask can have a diameter in the range from about 5 nm to 2000 nm and the alignment windows can have an area ranging from about 1 $\mu$m$^2$ to 0.36 mm$^2$. For EUV photolithography, the radiation employed typically has a short wavelength in the range of about 5 nm to 15 nm and in current prototype systems has a wavelength of about 13.4 nm. When employing radiation of this short wavelength, the pinholes in the null-mask typically range from about 50 nm to 150 nm in diameter and are preferably less than about 120 nm. Also, the alignment windows have an area typically 4 $\mu$m$^2$ to 25 $\mu$m$^2$ and preferably less than 16 $\mu$m$^2$.

It should be particularly noted that all the specific window sizes, pinhole sizes, and separations stated here have been chosen based on our implementation of testing 0.1 NA EUV lithographic optical systems. The optimal parameters will vary as a function of application. In general, the null mask pinholes should be smaller than the diffraction limited point-spread function (PSF) of the optical system under test. The size of the PS/PDI mask pinholes used for focusing should be on the order of the size of the PSF of the optical system under test or smaller. Finally, the reference and grating alignment windows should be significantly larger the PSF of the optical system under test.

Null Test Implementation

A preferred method of performing image point separation and orientation measurements employs a partially transmitting mask. Typically, the semi-transparent mask has a surface made of material that transmits about $10^{-3}$ to $10^{-7}$ of the incident electromagnetic power of the radiation. A preferred technique of measuring the pinhole separation and orientation is by determining the spatial frequency and orientation of fringes created by light diffracted by the two pinholes. This is most readily done by Fourier domain analysis. The two-pinhole fringes are easily recognized because they are present outside the numerical aperture (NA) of the optic under test due to the fact that in the PS/PDI the reference pinhole size is always chosen to be significantly smaller than the diffraction limited resolution limit of the optic under test. This in turn causes the pinhole diffracted light to cover a larger area of the CCD than would light simply imaged by the optic under test.

Because the preferred method employs the two-pinhole fringes to align the image points to the pinholes, the question of capture tolerance (how to get close enough to the pinholes to see the initial two-pinhole fringes) is considered. The alignment technique has a capture range limited by the spot size of the optic. With careful pre-alignment and mask design, this capture alignment can readily be achieved. For example, with a typical EUV lithographic system, this capture tolerance can be shown to be about one degree for the grating relative to image-plane mask rotation and about 1.5 mm for the grating-to-entrance-pinhole separation. As described above, the particular method presented here is intended for the nanometer level alignment required to perform a meaningful null test. With the system pre-aligned to capture tolerances, the image points are maneuvered to a pinhole pair in the image-plane mask array or vice versa in x-y. This is achieved by employing the large, easy to find, alignment windows on the mask and moving a prescribed distance to a pinhole pair. The actual motion can be performed in several ways including moving the optic alone thereby moving the image points relative to the mask, moving the optic and image-plane mask as a unit thereby moving the image points relative to the mask, or moving the image-plane mask alone. In interferometers where the object-plane illumination is broad or movable, it is also possible to move the image points relative to the mask by moving the entrance pinhole. In a preferred embodiment, the optic and image-plane stage are moved as a unit due to the optical demagnification this configuration provides compared to moving the optic or image-plane stage alone. For the 10× demagnification system considered here, this allows us to achieve a relative motion resolution between the image points and the mask that is ten times better than the actual mechanical resolution of the system. This is equivalent to moving the entrance pinhole alone, however, with an essentially immobile optical source (e.g., a synchrotron undulator beamline) moving the entrance pinhole is impractical. In the case of a more conventional optical source, such as an optical fiber, it may be preferable to move the entrance pinhole instead of the rest of the system.

Having measured the separation and orientation of the pinholes, as described above, there is now a target for the image point separation and orientation. The image point separation and orientation is determined by the grating and can be quantified by measuring the fringes present in the absence of the null-mask. Because it is impractical to remove and accurately replace the null-mask, it is desirable to measure the grating based fringes with the mask in place. This can be achieved by way of a partially transparent mask. 200-nm thick Ni absorber masks currently used for extreme ultraviolet PS/PDI with reference pinholes greater than 100 nm in diameter meet this criterion. The transmission of a 200-nm Ni mask at 13.4 nm, however, is less than $10^{-6}$, therefore care must be taken to design a mask that has sufficiently large feature-free areas such that the transmitted light fringes ("transmission-fringes") can be observed relative to the scattered light from the optic making it through open mask areas such as alignment windows. This becomes less of an issue as the quality of the optic, in terms of scatter, improves.

In order to observe the transmission fringes, the image points must be moved away from the pinholes by, for example, translating the optic and image-plane mask unit as described above. The image-plane mask design is setup in such a way that there are large feature free areas adjacent to the pinhole pairs allowing the transition from viewing two-pinhole fringes to viewing transmission-fringes to occur quickly.

In another method, where a partially transparent mask is not available or not practical, select window pairs are used to observe the transmission fringes. In this case, the image points are moved to a window pair and the resulting fringes are observed.

Experimental

To study the effectiveness of the null test alignment technique, a PS/PDI system as shown in FIG. 1A was employed. The optical system used was a two mirror system comprising a 10×-demagnification Schwarzchild objective with numerical aperture of 0.08 (image side) and measured system wavefront aberration magnitude on the order of 1 nm root-mean-squared (rms). Placed approximately 60 mm from the entrance pinhole on the 0.008 NA (object side) of the test optic is a square-wave transmission grating beam splitter with 18-micron pitch, producing approximately 50 fringes within the measurement numerical aperture. The grating is mounted to a motor-actuated stage that provides both rotation and height control.

The electromagnetic radiation source which provided coherent illumination was a synchrontron undulator beamline source (CXRO beamline 12.0.1.2 at the Advanced Light Source, Lawrence Berkeley National Laboratory) operating at a wavelength of 13.4 nm with a bandwidth $\lambda/\Delta\lambda$ of about 200. The null-mask employed was that illustrated in FIG. 4. The detector is a back-thinned, back-illuminated EUV CCD detector positioned 132 mm downstream from the image-plane mask.

Figure 5A:
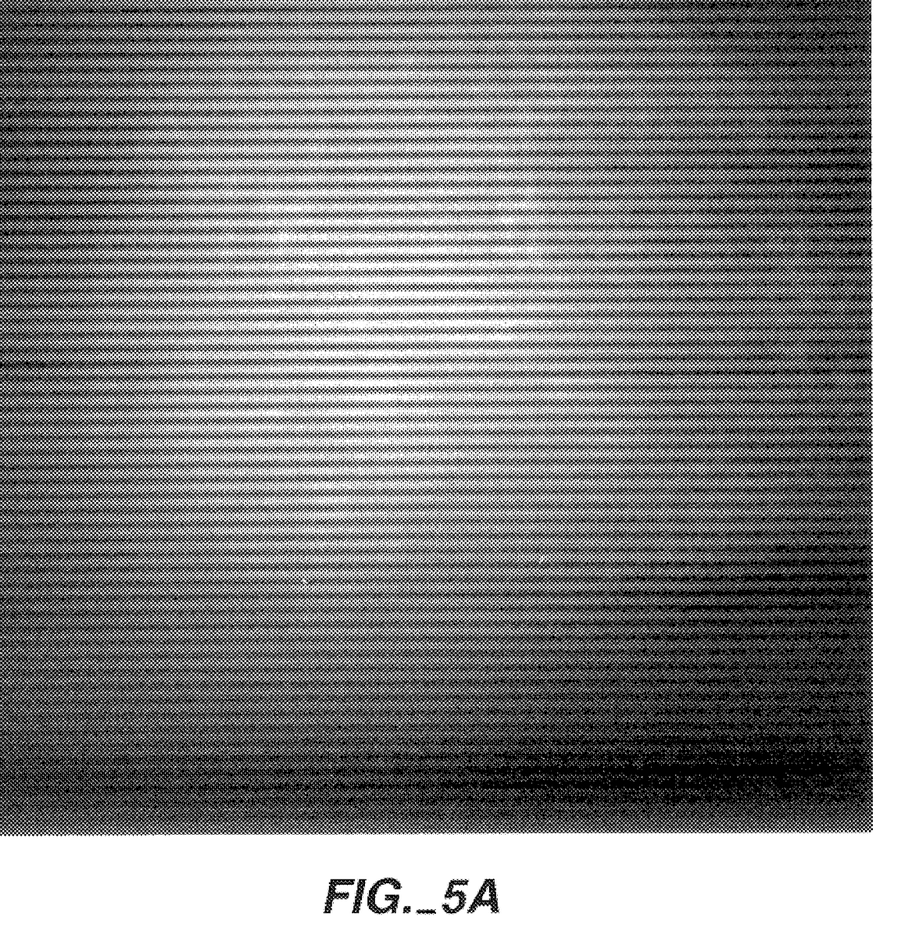
FIG. 5A depicts a representative two pinhole fringe pattern prior to alignment; these fringes are created by the light from the first and second image points propagating through a pinhole pair in the image-plane mask.
Figure 5B:
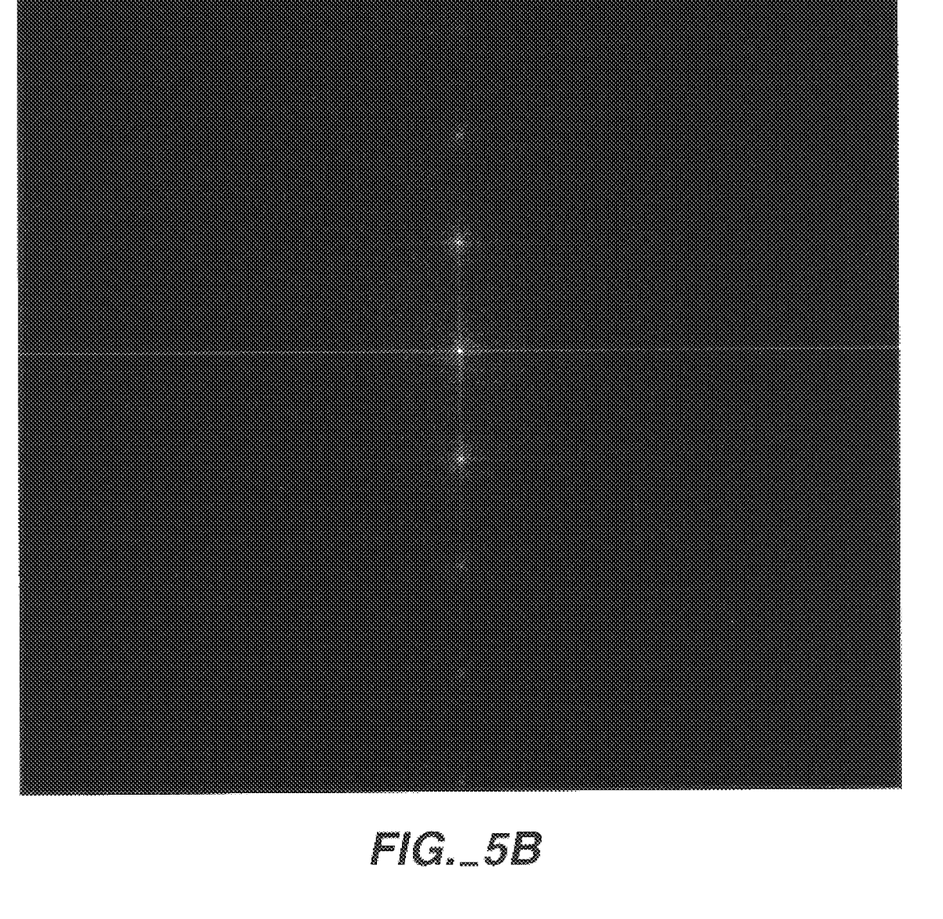
FIG. 5B depicts the Fourier transform of the two-pinhole fringe pattern of FIG. 5A.
Figure 5C:
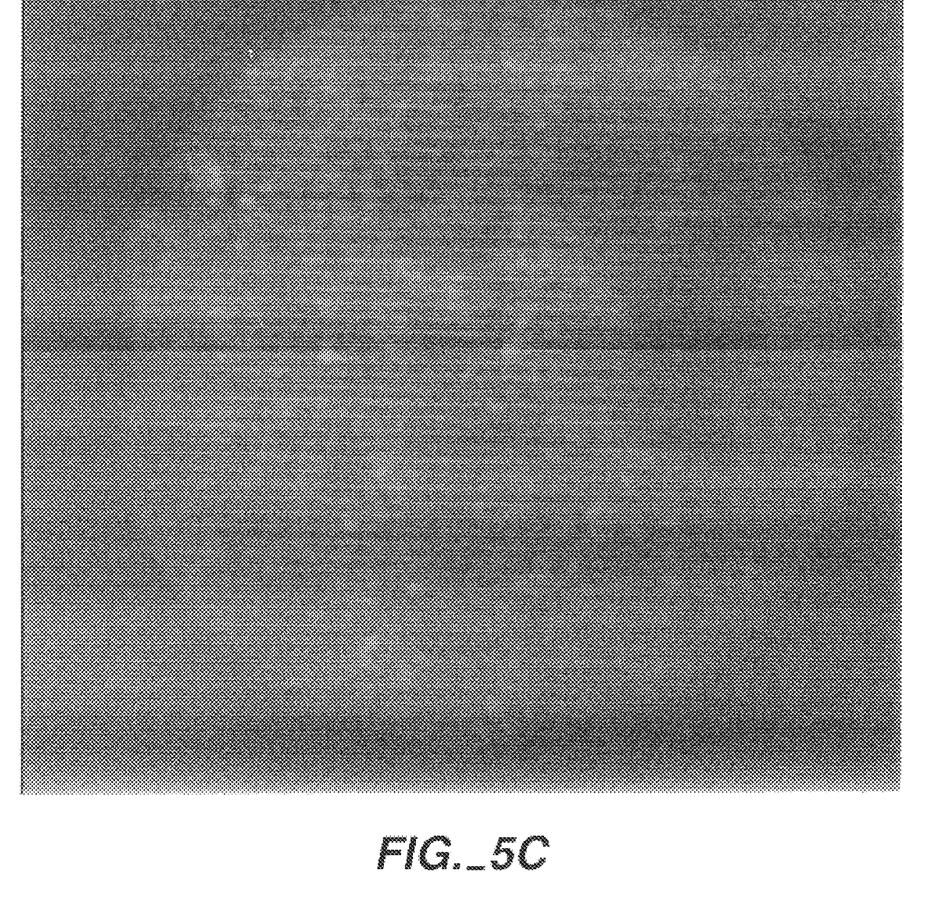
FIG. 5C depicts a representative fringe pattern created by the light from the first and second image points propagating through the at least partially transparent region of the image-plane mask; this fringe pattern is referred to as the transmission-fringe pattern.
Figure 5D:
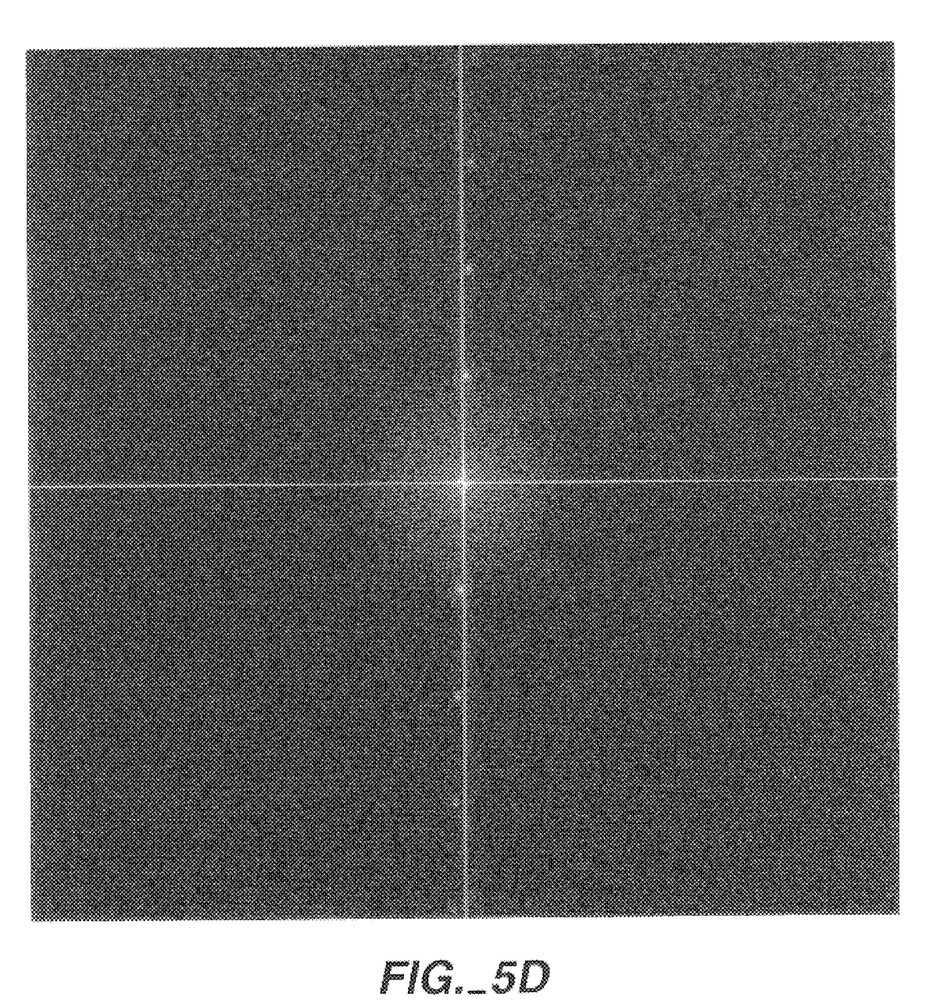
FIG. 5D depicts the Fourier transform of the transmission-fringe pattern of FIG. 5C.

FIGS. 5(a)–5(d) illustrate the Fourier domain alignment technique described above. FIG. 5(a) shows a representative two-pinhole fringe pattern prior to alignment. These fringes are obtained by positioning the image point pair in close proximity to a pinhole pair in the image-plane mask. The positioning must simply be accurate enough such that at least part of the first image point light gets through the first pinhole and at least part of the second image point light gets through the second pinhole. Fringes obtained under these conditions are seen to nearly extend to the edges of the CCD, which is beyond the NA of the optic under test as seen by the optic exit pupil outline in FIG. 5(c). FIG. 5(b) shows the Fourier transform of the two-pinhole fringe pattern clearly calling out the 2-D carrier frequency, hence the spatial frequency and orientation of the fringes. The pinhole orientation is seen to be well aligned to the CCD. FIG. 5(c) shows a representative transmission-fringe pattern. These fringes are obtained by positioning the first and second image points in an at least partially transparent region of the image-plane mask. The contrast is extremely low due to the high attenuation of the mask used here. The fringes are seen to be limited to the area set by the NA of the optic under test. FIG. 5(d) shows the Fourier transform again calling out the 2-D carrier which this time represents the grating alignment. The rotation of the grating relative to the CCD is evident and can be quantified allowing the proper adjustments to the grating or mask orientation to be made.

In this experiment, the adjustments were performed by rotating the grating in order to get the transmission-fringes to match the two-pinhole fringes. Alternatively, one could rotate the image-plane mask to get the two-pinhole fringes to match the transmission fringes.

Figure 6:
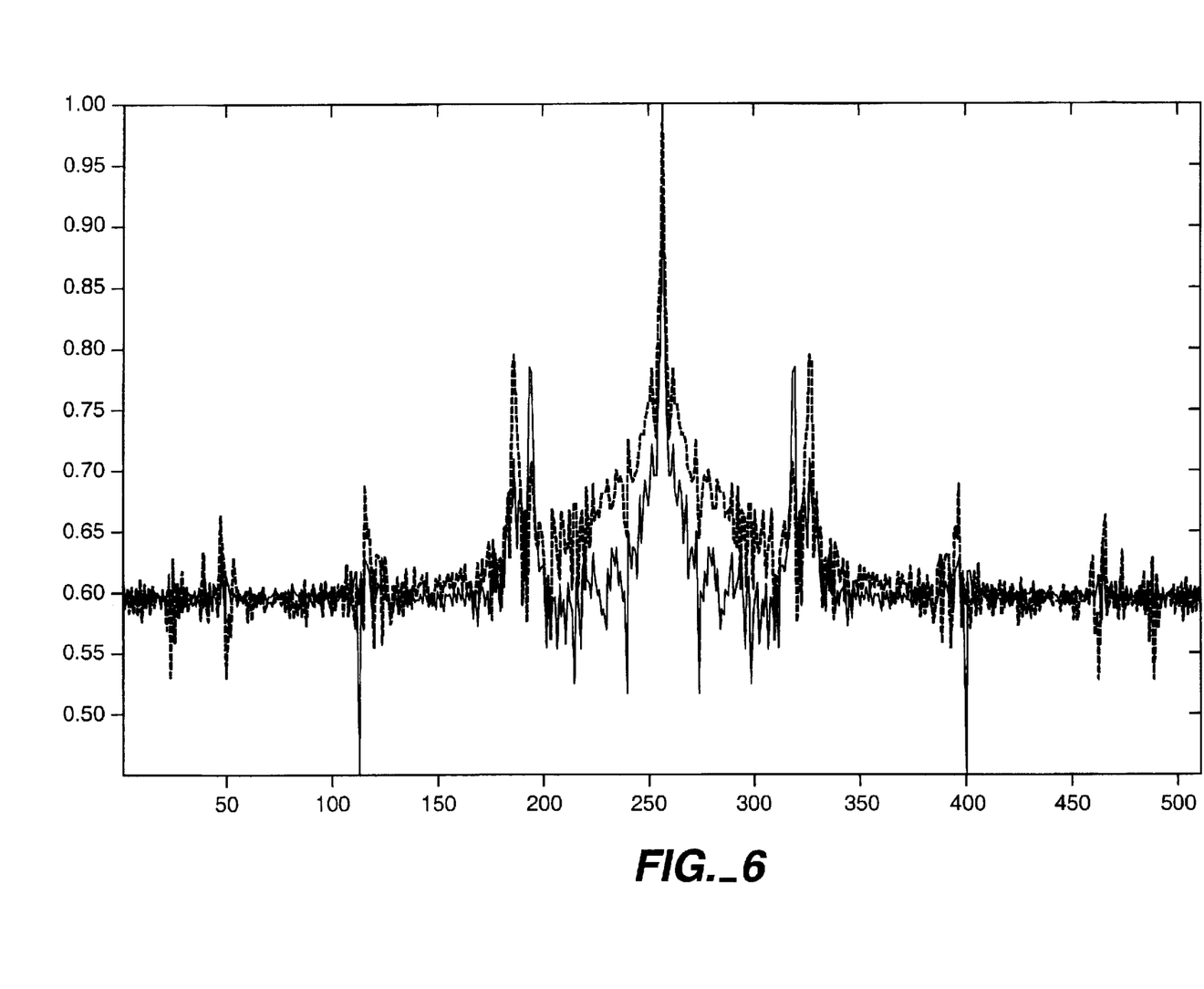
FIG. 6 depicts the line-outs of Fourier transforms of the two-pinhole fringe pattern and transmission-fringe pattern after rotation correction.

Having corrected the orientation, there remains the issue of image point separation relative to pinhole separation. Although the separation information is present in the data of FIGS. 5(a)–5(d) and both the orientation and separation misalignments may be corrected at the same time, the process is separated in this discussion for the sake of clarity. FIG. 6 shows line-outs of Fourier transforms of the two-pinhole fringe spectrum and transmission-fringe spectrum after correction of the grating orientation. The solid line is the two-pinhole pattern and the dashed line is the grating pattern. Note the increased power of the higher order terms in the dashed line (transmission fringes) due to the square wave grating. These higher order terms are less evident in the two-pinhole fringe case as the fringes are dominated by light originating from the two pinholes as opposed to all the grating orders. The separation of the carrier term (the first non-centered peaks to the left and right of center) for the two cases is indicative of the grating-to-object-pinhole separation error. The required correction can be readily determined from the known geometry of the system. The correction is made by moving the grating longitudinally (z).

Figure 7:
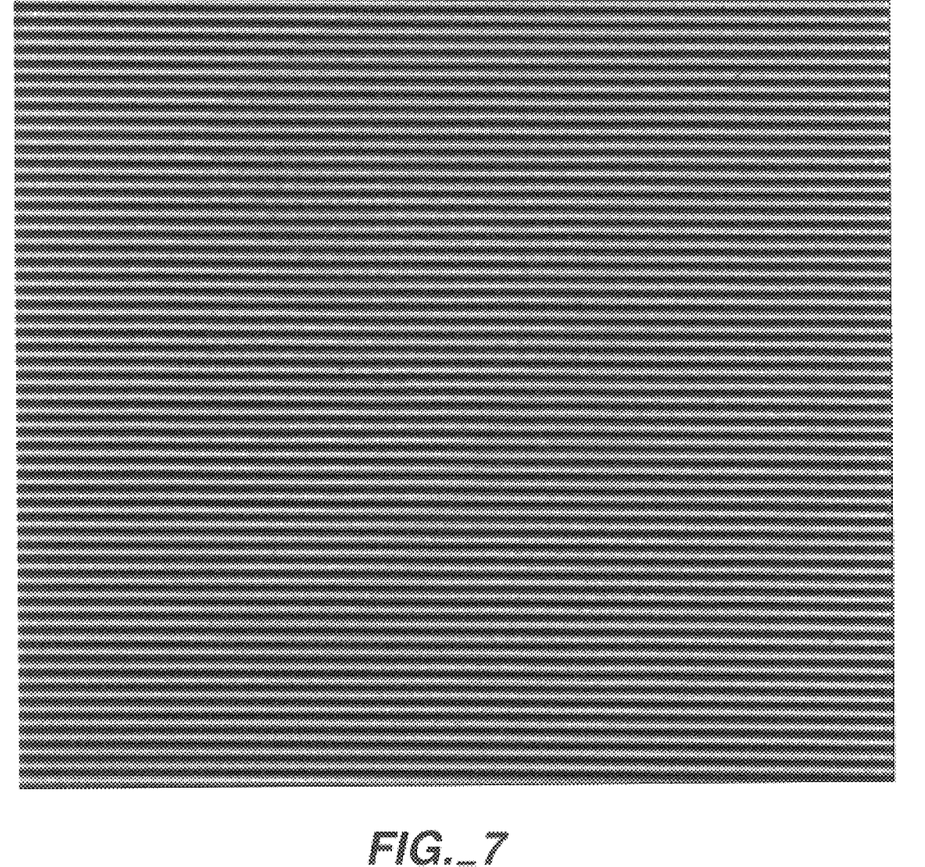
FIG. 7 depicts a two-pinhole fringe pattern after alignment has been achieved.

FIG. 7 shows the two-pinhole interferogram after completion of the alignment. The dramatic improvement over the two-pinhole fringes obtained with only capture-tolerance alignment (FIG. 5(a)) is evident.

The accuracy of this alignment technique is limited by the repeatability in the measurement of the interferometric tilt terms. This repeatability has experimentally been found to be about 3.3 nm (3) for the two-pinhole fringes and ~0.9 nm (3) for the transmission fringes, yielding an alignment accuracy of 3.4 nm (3). The counterintuitive larger error with the higher contrast two-pinhole fringes is most likely due to the pinholes not being small enough to completely remove the tilt term of the illuminating spot.

Although only preferred embodiments of the invention are specifically disclosed and described above, it will be appreciated that many modifications and variations of the present invention are possible in light of the above teachings and within the purview of the appended claims without departing from the spirit and intended scope of the invention.

What is claimed is:

1. A method of measuring the accuracy of a phase-shifting point diffraction interferometer defining an optical path that includes (i) a source of electromagnetic energy in the optical path, (ii) a beam divider in the optical path for dividing electromagnetic radiation from the source into a reference beam and a test beam, (iii) an optical element under test in the optical path, and (iv) a fixed reference coordinate system in the optical path downstream from the source of electromagnetic energy, wherein the method comprises the steps of (a) positioning a null test mask in the image plane of the optical system under test positioned upstream of the fixed reference coordinate system wherein the mask has a region that is at least semi-transparent and at least one pair of pinholes and a corresponding alignment window, wherein each pair of pinholes comprises a first pinhole and a second pinhole that are spaced apart at a predetermined distance, whereby a reference beam and a test beam are directed to said region of the mask the two beams create first and second image points on said region;

(b) aligning the image points and pinholes with respect to rotation orientation such that the image point orientation is substantially the same as that of the pinholes;

(c) aligning the image points and the pinholes with respect to separation such that the images points are separated by a distance that is substantially the same as that between the pinholes; and (d) measuring aberrations of the phase-shifting point diffraction interferometer.

2. The method of claim 1 wherein step (b) comprises measuring the pinhole rotational orientation with respect to the fixed reference coordinate system and then aligning the image point rotational orientation with respect to the same fixed reference coordinate system or measuring the image point rotational orientation with respect to the fixed reference coordinate system and then aligning the pinhole rotational orientation with respect to the same fixed reference coordinate system and step (c) comprises measuring the pinhole separation with respect to the fixed reference coordinate system and then aligning the image point separation with respect to the same fixed reference coordinate system.

3. The method of claim 1 wherein the beam divider is a diffraction grating.

4. The method of claim 1 wherein the fixed reference coordinate system is a camera.

5. A method of measuring the accuracy of a phase-shifting point diffraction interferometer defining an optical path that includes (i) a source of electromagnetic energy in the optical path, (ii) a beam divider in the optical path for dividing electromagnetic radiation from the source into a reference beam and a test beam, (iii) an optical element under test in the optical path, and (iv) a fixed reference coordinate system in the optical path downstream from the source of electromagnetic energy, wherein the method comprises the steps of:

(a) positioning a null test mask in the image plane of the optical element under test positioned upstream of the fixed reference coordinate system wherein the mask has a region that is at least semi-transparent and at least one pair of pinholes and a corresponding alignment window, wherein each pair of pinholes comprises a first pinhole and a second pinhole that are spaced apart at a predetermined distance;

(b) activating the source of electromagnetic radiation and directing the electromagnetic radiation to the beam divider to generate a reference and a test beam that are directed by the optical element under test to the null test mask whereby the two beams create first and second image points on the mask;

(c) adjusting the position of the first and second image points such that the first and second image points lie on said region of the mask;

(d) determining the (i) first rotational orientation of the first and second image points with respect to the fixed reference coordinate system and (ii) the first separation between the first and second image points by examining interference fringes created by light from the first and second image points propagating through said region of the mask;

(e) adjusting the position of the first and second image points such that at least part of the reference beam passes through the first pinhole and at least part of the test beam passes through the second pinhole, respectively;

(f) determining the (i) second rotational orientation of the first and second pinholes of a pair of pinholes in the mask with respect to the fixed coordinate system and (ii) the second separation between the first and second pinholes by examining interference fringes created by light from the first and second image points propagating through the pair of pinholes;

(g) adjusting the rotation of at least one of (i) the beam divider or (ii) the mask so that the first rotational orientation substantially matches the second rotational orientation;

(h) adjusting the position of the beam divider so that the first separation substantially matches the second separation; and (i) measuring aberrations of the phase-shifting point diffraction interferometer.

6. The method of claim 5 wherein the beam divider is a diffraction grating.

7. The method of claim 6 wherein the diffraction grating is positioned between the source of the electromagnetic radiation and the optical element.

8. The method of claim 5 wherein the fixed reference coordinate system is a camera.

9. The method of claim 8 wherein the fixed reference coordinate system is a charged-coupled device.

10. The method of claim 5 wherein step (d) comprises:

determining the (i) first rotational orientation of the first and second image points with respect to the fixed reference coordinate system and (ii) the first separation between the first and second image points by calculating the two-dimensional carrier frequency of the interference fringes created by the light from the first and second image points propagating through said region of the mask; and wherein step (f) comprises:

determining the (i) second rotational orientation of the first and second pinholes of a pair of pinholes in the mask with respect to the fixed coordinate system and (ii) the second separation between the first and second pinholes by calculating the two-dimensional carrier frequency of the interference fringes created by the light from the two image points propagating through the pinhole pair.

11. The method of claim 5 wherein step (d) comprises:

determining the (i) first rotation orientation of the first and second image points with respect to the fixed reference coordinate system and (ii) the first separation between the first and second image points by calculating the Fourier transform of the interference fringes created by the light from the first and second image points propagating through said region of the mask in order to find the two-dimensional carrier frequency of the fringes; and wherein step (f) comprises:

determining the (i) second rotational orientation of the first and second pinholes of a pair of pinholes in the mask with respect to the fixed coordinate system and (ii) the second separation between the first and second pinholes by calculating the Fourier transform by the interference fringes created by the light from the two image points propagating through the pinhole pair in order to find the two-dimensional carrier frequency of the fringes.

12. The method of claim 5 wherein step (d) comprises:

determining the (i) first rotational orientation of the first and second image points with respect to the fixed reference coordinate system and (ii) the first separation between the first and second image points by calculating the tilt term of the wavefront defined by the interference fringes created by the light from the two image points propagating through said region of the mask in order to find the two-dimensional carrier frequency of the fringes; and wherein step (f) comprises:

determining the (i) second rotational orientation of the first and second pinholes of a pair of pinholes in the mask with respect to the fixed coordinate system and (ii) the second separation between the first and second pinholes by calculating the tilt term of the wavefront defined by the interference fringes created by the light from the first and second image points propagating through the pinhole pair in order to find the two-dimensional carrier frequency of the fringes.

13. The method of claim 5 wherein the at least one pair of pinholes are positioned to the corresponding alignment window at a known distance and direction, and wherein step (e) comprises the steps of:

moving at least one of the (i) the optical element under test, (ii) the mask, or (iii) the source of electromagnetic energy so that the at least one of the reference beam or test beam passes through the alignment window; and moving at least one of the (i) the optical element under test, (ii) the mask, or (iii) the source of electromagnetic energy so that at least part of the reference beam passes through the first pinhole and at least part of the test beam passes through the second pinhole, respectively.

14. The method of claim 5 wherein the at least one pair of pinholes comprises a plurality of pinholes and associated alignment windows.

15. The method of claim 8 wherein said region of the mask is semi-transparent surface and step (c) comprises adjusting the position of the first and second image points such that the image points lie in the semi-transparent region of the mask.

16. The method of claim 5 wherein said region of the mask comprises a surface that defines first and second apertures that are each larger than the individual image points and wherein step (c) comprises adjusting the position of the first and second image points such that the first image point passes through the first aperture and the second image point passes through the second aperture.

17. The method of claim 16 wherein the first and second pinholes each has a diameter of less than about 120 nm.

18. The method of claim 16 wherein the first and second pinholes each has a diameter of about 5 nm to 2000 nm.

19. The method of claim 5 wherein the first and second pinholes each has a diameter of about 5 nm to 2000 nm.

20. The method of claim 5 wherein each window defines an opening with an area of about 1 micron$^2$ to 0.36 millimeter$^2$.

21. The method of claim 5 wherein each window is a square-shaped opening.

22. The method of claim 15 wherein the semi-transparent surface is made of material that has the property of transmitting about $10^{-3}$ to $10^{-7}$ of the incident electromagnetic power.

23. The method of claim 5 wherein the electromagnetic radiation has a wavelength of about 5 nm to 1500 nm.

24. The method of claim 5 wherein step (g) comprises adjusting the rotation of the beam divider so that the first rotational orientation substantially matches the second rotational orientation.

25. The method of claim 5 wherein step (g) comprises adjusting the rotation of the mask so that the first rotational orientation substantially matches the second rotational orientation.

26. A phase-shifting point diffraction interferometer system suitable for calibration that defines an optical path, said system comprising:

(a) a source of electromagnetic energy in the optical path;

(b) a beam divider in the optical path for dividing electromagnetic radiation from the source into a reference beam and a test beam;

(c) a fixed reference coordinate system in the optical path downstream from the source of electromagnetic energy;

(d) a null-test mask that is positioned in the image plane of an optical element under test positioned upstream of the fixed reference coordinate system wherein the null-test mask has a region that is at least semi-transparent and at least one pair of pinholes and a corresponding alignment window, wherein each pair of pinholes comprises a first pinhole and a second pinhole that are spaced apart at a predetermined distance, and wherein the reference and test beams are directed by the optical element under test to said region of the null-test mask whereby the two beams create first and second image points on said region;

(e) means for adjusting the position of the first and second image points such that the first and second image points lie on said region of the mask;

(f) means for determining the (i) first rotational orientation of the first and second image points with respect to the fixed reference coordinate system and (ii) the first separation between the first and second image points by examining interference fringes created by light from the first and second image points propagating through said region of the mask;

(g) means for adjusting the position of the first and second image points such that at least part of the reference beam passes through the first pinhole and at least part of the test beam passes through the second pinhole, respectively;

(h) means for determining the (i) second rotational orientation of the first and second pinholes of a pair of pinholes in the mask with respect to the fixed coordinate system and (ii) the second separation between the first and second pinholes by examining interference fringes created by light from the first and second image points propagating through the pair of pinholes;

(i) means for adjusting the rotation of at least one of (i) the beam divider or (ii) the mask so that the first rotational orientation substantially matches the second rotational orientation;

(j) means for adjusting the position of the beam divider so that the first separation substantially matches the second separation; and (k) means for measuring aberrations of the phase-shifting point diffraction interferometer.

27. The system of claim 26 wherein the beam divider is a diffraction grating.

28. The system of claim 26 wherein the diffraction grating is positioned between the source of the electromagnetic radiation and the optical element.

29. The system of claim 26 wherein the fixed reference coordinate system is a camera.

30. The system of claim 29 wherein the fixed reference coordinate system is a charged-coupled device.

31. The system of claim 26 wherein the at least one pair of pinholes are positioned to the corresponding alignment window at a known distance and direction, and wherein (g) comprises;

means for moving at least one of the (i) the optical element under test, (ii) the mask, or (iii) or the source of electromagnetic energy so that the at least one of the reference beam or test beam passes through the alignment window; and means for moving at least one of the (i) the optical element under test, (ii) the mask, or (iii) or the source of electromagnetic energy so that at least part of the reference beam passes through the first pinhole and at least part of the test beam passes through the second pinhole, respectively.

32. The system of claim 26 wherein the at least one pair of pinholes comprises a plurality of pinholes and associated alignment windows.

33. The system of claim 26 wherein said region of the mask is semi-transparent surface and (e) comprises adjusting the position of the first and second image points such that the image points lie in the semi-transparent region of the mask.

34. The system of claim 26 wherein said region of the mask comprises a surface that defines first and second apertures that are each larger than the individual image points and wherein (e) comprises means for adjusting the position of the first and second image points such that the first image point passes through the first aperture and the second image point passes through the second aperture.

35. The system of claim 34 wherein the first and second pinholes each has a diameter of less than about 120 nm.

36. The system of claim 34 wherein the first and second pinholes each has a diameter of about 5 nm to 2000 nm.

37. The system of claim 26 wherein the first and second pinholes each has a diameter of about 5 nm to 2000 nm.

38. The system of claim 26 wherein each window defines an opening with an area of about 1 micron$^2$ to 0.36 millimeter$^2$.

39. The system of claim 26 wherein each window is a square-shaped opening.

40. The system of claim 33 wherein the semi-transparent surface is made of material that has the property of transmitting about $10^{-3}$ to $10^{-7}$ of the incident electromagnetic power.

41. The system of claim 26 wherein the electromagnetic radiation has a wavelength of about 5 nm to 1500 nm.

* * * * *